United States Patent
Ahn et al.

(10) Patent No.: US 10,518,237 B2
(45) Date of Patent: Dec. 31, 2019

(54) GAS DISTRIBUTION UNIT FOR FLUIDIZED BED REACTOR SYSTEM, FLUIDIZED BED REACTOR SYSTEM HAVING THE GAS DISTRIBUTION UNIT, AND METHOD FOR PREPARING GRANULAR POLYCRYSTALLINE SILICON USING THE FLUIDIZED BED REACTOR SYSTEM

(71) Applicant: HANWHA CHEMICAL CORPORATION, Seoul (KR)

(72) Inventors: Gui Ryong Ahn, Daejeon (KR); Sang ah Kim, Incheon (KR); Ji Ho Kim, Suncheon-si (KR); Joo Hee Han, Seoul (KR); Gil Ho Kim, Daejeon (KR); Won Ik Lee, Seoul (KR)

(73) Assignee: HANWHA CHEMICAL CORPORATION, Seoul (KR)

( * ) Notice: Subject to any disclaimer, the term of this patent is extended or adjusted under 35 U.S.C. 154(b) by 90 days.

(21) Appl. No.: 15/549,759

(22) PCT Filed: Mar. 24, 2016

(86) PCT No.: PCT/KR2016/002990
§ 371 (c)(1),
(2) Date: Aug. 9, 2017

(87) PCT Pub. No.: WO2016/159568
PCT Pub. Date: Oct. 6, 2016

(65) Prior Publication Data
US 2018/0028998 A1    Feb. 1, 2018

(30) Foreign Application Priority Data

Apr. 1, 2015 (KR) .................. 10-2015-0046386
Apr. 16, 2015 (KR) .................. 10-2015-0053976

(51) Int. Cl.
*B01J 8/22*    (2006.01)
*B01J 8/44*    (2006.01)
(Continued)

(52) U.S. Cl.
CPC .    *B01J 8/22* (2013.01); *B01J 8/44* (2013.01); *C01B 33/021* (2013.01); *C23C 16/24* (2013.01); *C23C 16/442* (2013.01)

(58) Field of Classification Search
CPC .... B01J 8/1818; B01J 8/22; B01J 8/44; C23C 16/442; F27B 15/10; F27B 15/20
See application file for complete search history.

(56) References Cited

U.S. PATENT DOCUMENTS 5,382,412 A    1/1995    Kim et al.
6,827,786 B2    12/2004    Lord
(Continued)

FOREIGN PATENT DOCUMENTS

CN    103553047    2/2014
DE    102013208274    11/2014
(Continued)

OTHER PUBLICATIONS

KIPO, PCT Search Report & Written Opinion of PCT/KR2016/002990, dated Jul. 8, 2016.
(Continued)

*Primary Examiner* — Amber R Orlando
*Assistant Examiner* — Syed T Iqbal
(74) *Attorney, Agent, or Firm* — Lex IP Meister, PLLC

(57) ABSTRACT

The present invention relates to a gas distribution unit for a fluidized bed reactor system, a fluidized bed reactor system having the gas distribution unit, and a method for preparing granular polysilicon using the fluidized bed reactor system. The gas distribution unit for a fluidized bed reactor system according to the present invention enables gas flow rate
(Continued)

control and gas composition control for each zone within the plenum chamber. In addition, a fluidized bed reactor system having the gas distribution unit enables shape control of a fluidized bed (in particular, transition between a bubbling fluidized bed and a spout fluidized bed). The method for preparing granular polysilicon using the fluidized bed reactor system not only simultaneously improves process stability and productivity, but also enables more flexible handling in the event of an abnormal situation.

14 Claims, 7 Drawing Sheets

(51) Int. Cl.
 C23C 16/24 (2006.01)
 C23C 16/442 (2006.01)
 C01B 33/021 (2006.01)

(56) References Cited

U.S. PATENT DOCUMENTS

| | | | |
|---|---|---|---|
| 8,075,692 B2 | 12/2011 | Osborne et al. | |
| 2011/0158857 A1 | 6/2011 | Erk | |
| 2011/0244124 A1 | 10/2011 | Kulkarni et al. | |
| 2014/0017137 A1* | 1/2014 | Sansegundo-Sanchez | B01J 8/1827 422/146 |
| 2016/0185614 A1* | 6/2016 | Kwon | B01J 8/1827 423/492 |

FOREIGN PATENT DOCUMENTS

| | | |
|---|---|---|
| EP | 1752991 | 2/2007 |
| JP | 52-141079 | 11/1977 |
| JP | 10-001445 | 1/1998 |
| JP | 11-510560 | 9/1999 |
| JP | 2008-049259 | 3/2008 |
| JP | 2009-149498 | 7/2009 |
| KR | 10-2008-0039911 | 5/2008 |
| KR | 10-2011-0037981 | 4/2011 |
| KR | 10-2012-0086422 | 8/2012 |
| KR | 10-2013-0123864 | 11/2013 |

OTHER PUBLICATIONS

EPO, A European Search Report of EP 16773349.2 dated Dec. 17, 2018.

* cited by examiner

[FIG. 1]
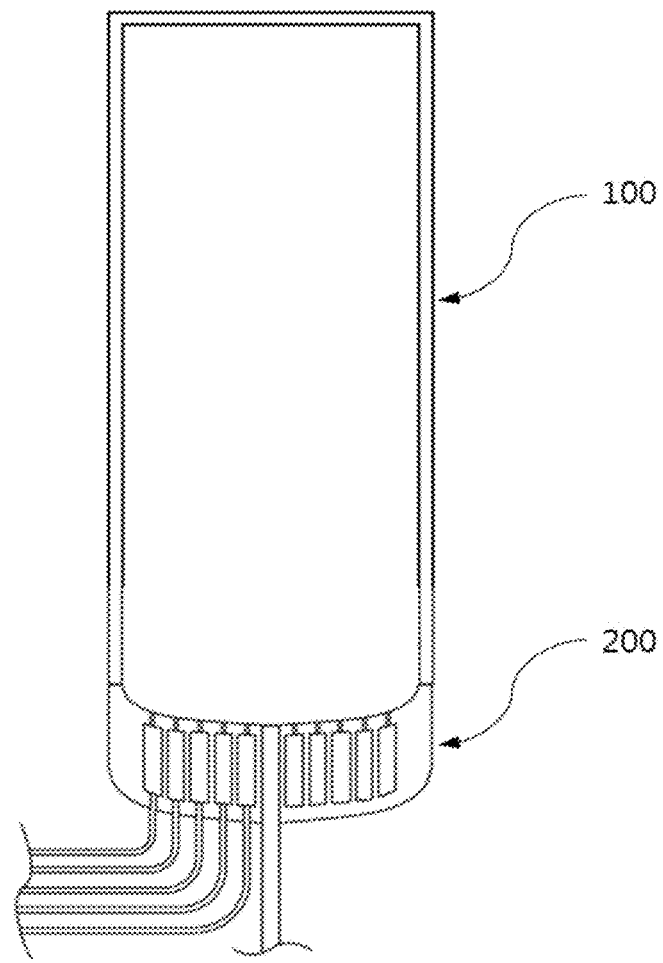

[FIG. 2]
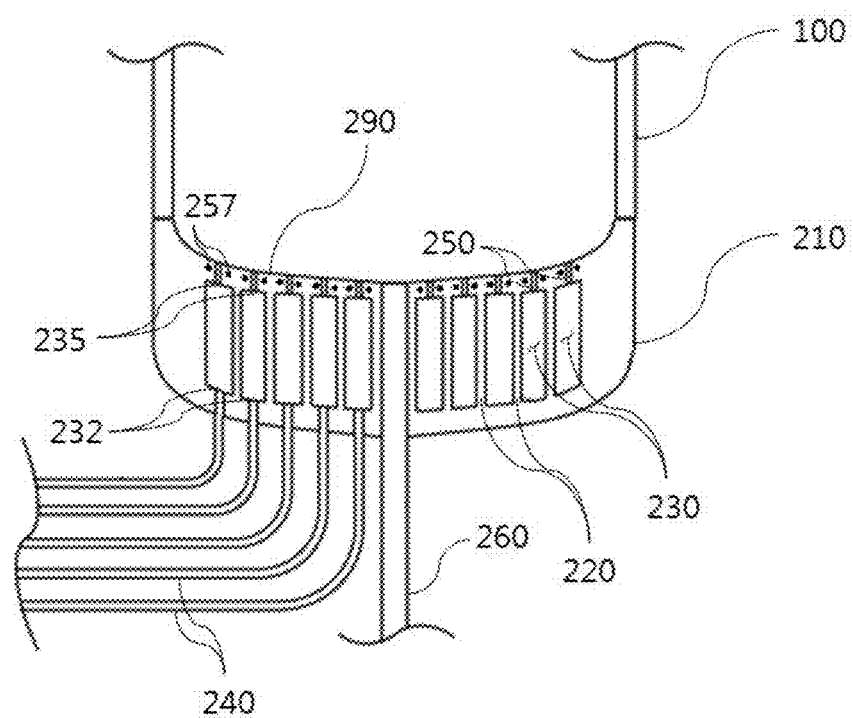

[FIG. 3]
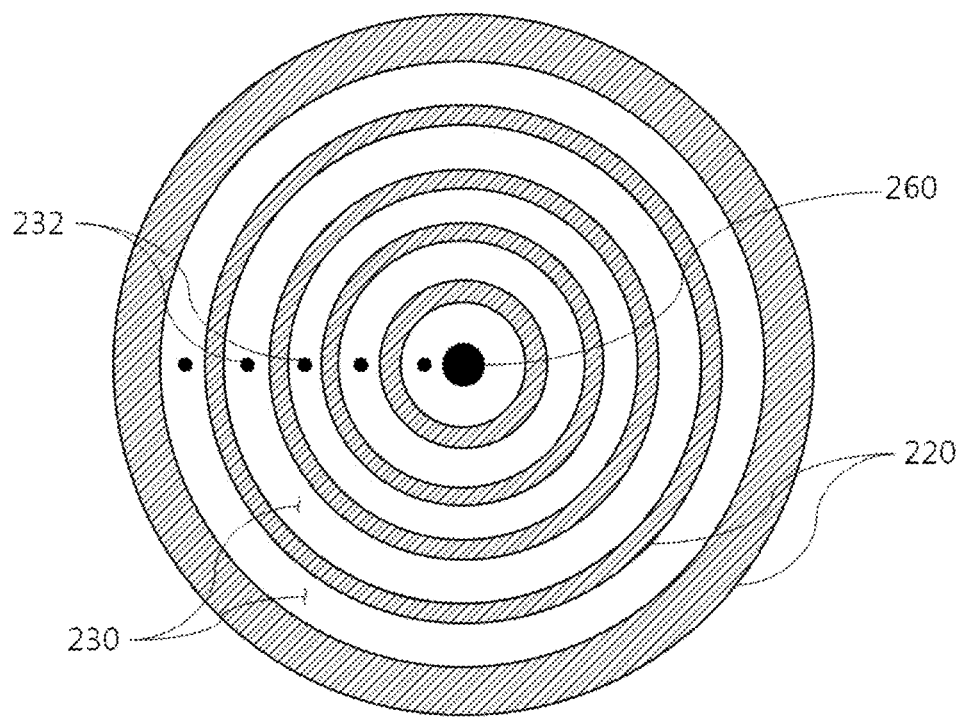

[FIG. 4]
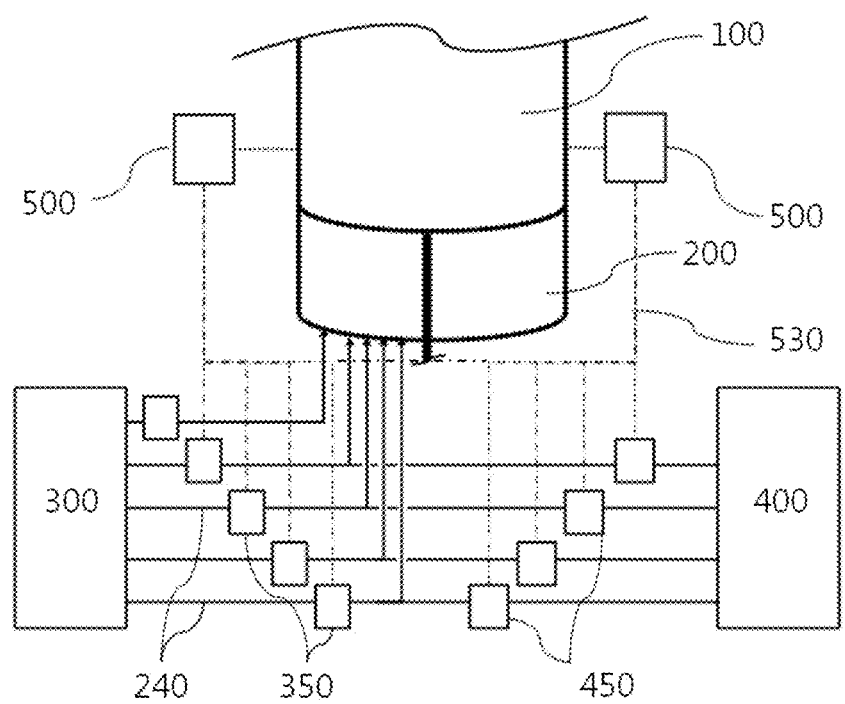

[FIG. 5]
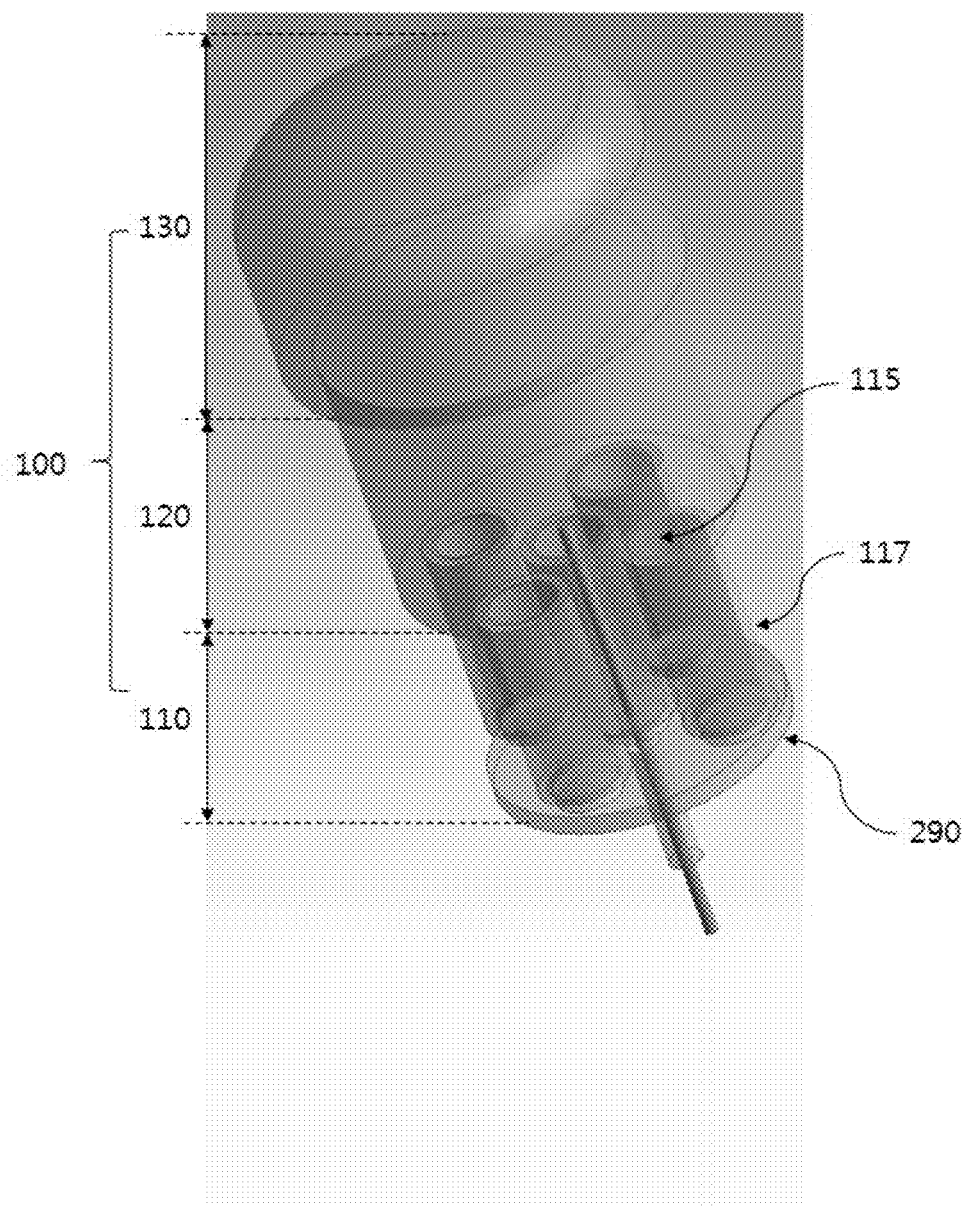

[FIG. 6]
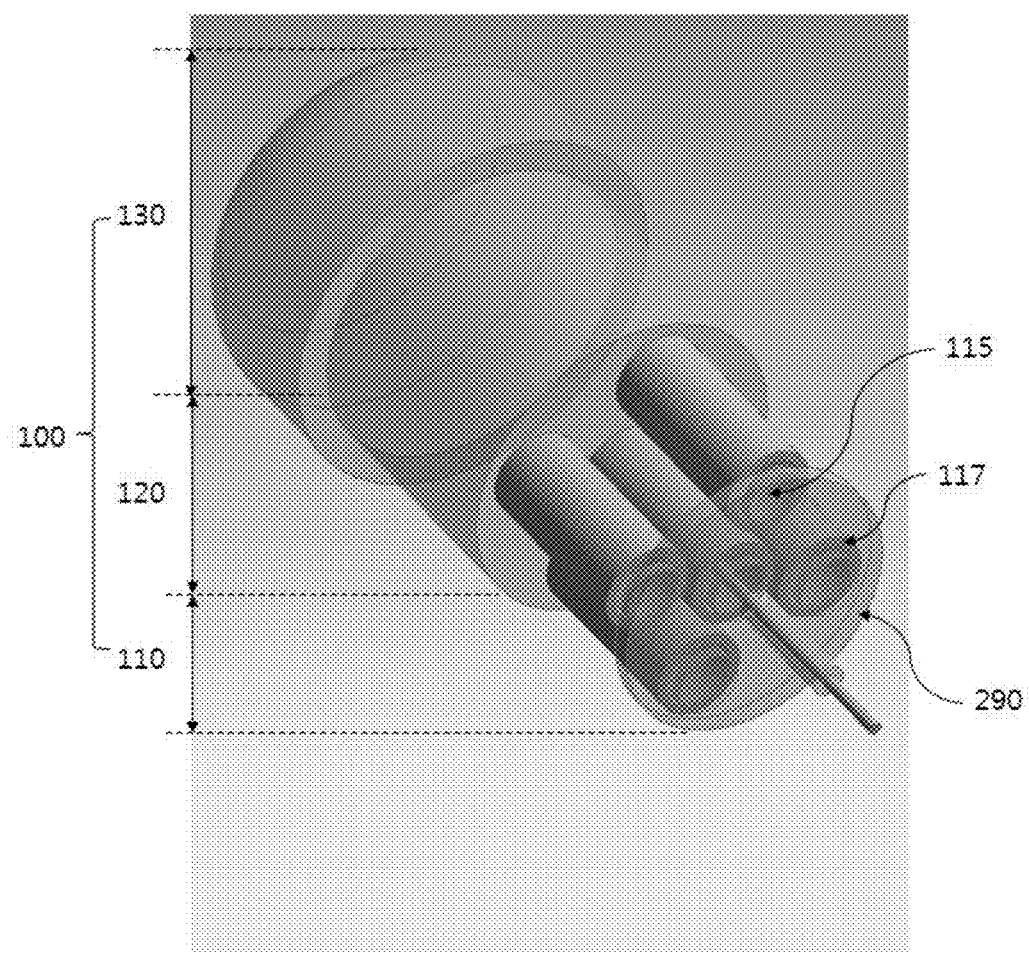

[FIG. 7]
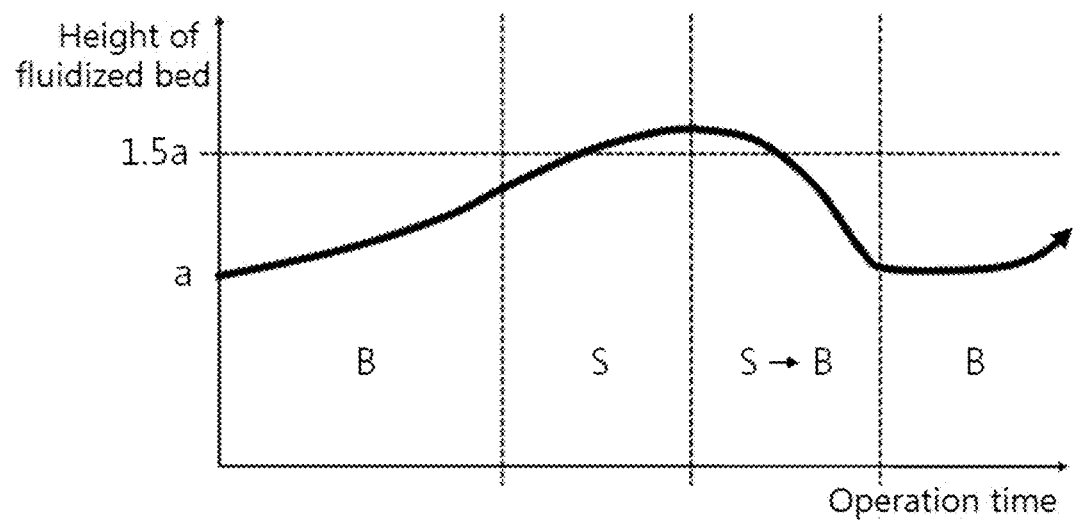

GAS DISTRIBUTION UNIT FOR FLUIDIZED BED REACTOR SYSTEM, FLUIDIZED BED REACTOR SYSTEM HAVING THE GAS DISTRIBUTION UNIT, AND METHOD FOR PREPARING GRANULAR POLYCRYSTALLINE SILICON USING THE FLUIDIZED BED REACTOR SYSTEM

CROSS-REFERENCE TO RELATED APPLICATION(S)

This application claims the benefit of priorities from Korean Patent Application No. 10-2015-0046386 filed on Apr. 1, 2015 and Korean Patent Application No. 10-2015-0053976 filed on Apr. 16, 2015 with the Korean Intellectual Property Office, the disclosures of which are incorporated herein by reference in their entirety.

TECHNICAL FIELD

The present invention relates to a gas distribution unit for a fluidized bed reactor system, a fluidized bed reactor system having the gas distribution unit, and a method for preparing granular polycrystalline polysilicon using the fluidized bed reactor system.

BACKGROUND OF ART

Polysilicon is a basic raw material for the photovoltaic and semiconductor industries, and demand thereof has dramatically increased along with the development of its related industrial fields in recent years.

Polysilicon is mainly manufactured by a method of precipitating a silicon element on a silicon surface through thermal decomposition and/or a hydrogen reduction reaction of a silicon-containing source gas, and representative examples thereof include a method using a bell-jar type of reactor (also called Siemens method) and a method using a fluidized bed reactor.

Among them, the Siemens method is a traditional method of depositing silicon on the surface of a silicon rod provided in a bell-jar reactor. In the Siemens process, the surface area required for the deposition of silicon is limited and there is a limitation to the diameter of the silicon rod which is increased by the precipitation reaction, so a continuous process is impossible. In addition, the Siemens method has a limitation in productivity because the power consumption per unit weight of polysilicon to be produced is high.

The method using a fluidized bed reactor is a method of obtaining granular polysilicon by injecting a silicon source gas into a fluidized bed of a silicon seed which is heated and flowing at a high temperature, and depositing silicon on the surface of the seed. In the method using a fluidized bed reactor, the surface area of the seed in which deposition of silicon can occur is wide, the deposition of silicon can be performed at a relatively low temperature, and the post-treatment process is simple, such productivity is high compared to the Siemens method.

In the method using a fluidized bed reactor, the pattern of the fluidized bed is largely divided into a bubbling fluidized bed and a spout fluidized bed.

In the bubbling fluidized bed, small bubbles are uniformly distributed throughout the fluidized bed to form a constant turbulent flow pattern, which is advantageous for material and heat transfer. Such a method utilizing a bubbling fluidized bed is suitable for obtaining products having a uniform particle size and high purity with a low speed and low concentration operation, and internal abrasion damage to the reactor is not severe. However, in the case of the bubbling fluidized bed, since momentum of the supplied reaction gas is not large, it is difficult to cope with a layer separation phenomenon which occurs when the particles grow to a certain size or more. Therefore, the method using the bubbling fluidized bed has a limitation that the discharge of the product and the replenishment of the seed must be performed in a short cycle.

The spout fluidized bed shows a flow pattern in which a high-speed and high-concentration reaction gas is intensively injected from the center of the reactor, particles from the central portion ascend, and particles from the outer portion descend. In such a spout fluidized bed, since it is advantageous in coping with formation of particle agglomerates and the generation of fine particles, the concentration of the silicon source gas can be set to be higher than that during the operation of the bubbling fluidized bed. In the spout fluidized bed, since a gas having high momentum is supplied, the non-fluidization phenomenon does not easily occur even if resistance increases. In addition, in the spout fluidized bed, in order to prevent high-speed reaction gas from passing through the fluidized bed without reaction, the height of the fluidized bed is set to be higher than that of the bubbling fluidized bed.

However, an increase in the height of the fluidized bed means an increase in the height of the reactor, and the abrasion damage to the inside of the reactor may become severe due to high-speed particle flow. Therefore, the method using the spout fluidized bed has a disadvantage in that the installation and maintenance costs of the reactor are high. Further, when the size of the seeds in the spout fluidized bed is small, an entrainment phenomenon due to a strong flow velocity may occur, so that there is a restriction in using seeds exceeding a certain size.

Thus, in the method using the fluidized bed reactor, the process stability and the productivity are in a trade-off relationship with each other depending on the pattern of the fluidized bed, so there is an urgent need for a method and means capable of simultaneously improving the stability and productivity of the polysilicon preparing process.

Prior Art Documents

Patent Documents (Patent Document 1) U.S. Pat. No. 8,075,692 (Dec. 13, 2011)
(Patent Document 2) U.S. Pat. No. 5,382,412 (Jan. 17, 1995)
(Patent Document 3) U.S. Pat. No. 6,827,786 (Dec. 7, 2004)

DETAILED DESCRIPTION OF THE INVENTION

Technical Problem

It is one object of the present invention to provide a gas distribution unit for a fluidized bed reactor system that enables gas flow rate control and gas composition control for each zone within a plenum chamber.

It is another object of the present invention to provide a fluidized bed reactor system having a gas distribution unit that enables shape control of a fluidized bed (in particular, transition between a bubbling fluidized bed and a spout fluidized bed).

It is a further object of the present invention to provide a method for preparing granular polysilicon which can simultaneously improve process stability and productivity.

Technical Solution

According to an embodiment of the invention, there is provided a gas distribution unit 200 for a fluidized bed reactor system that injects a gas into a fluidized bed reaction chamber 100 via a plenum chamber 210 and a perforated plate 290, wherein the plenum chamber 210 includes: a plurality of annular partition walls 220 arranged concentrically and spaced apart from each other; a plurality of annular spaces 230 partitioned by the annular partition walls and each independently having at least one gas inlet 232 and a plurality of gas outlets 235; a plurality of gas supply pipes 240 connected to the gas inlets 232 and independently supplying gas to the annular spaces 230; and a plurality of gas discharge pipes 250 connected to the respective gas outlets 235, and wherein the perforated plate 290 is in contact with the end of the gas discharge pipes 250 of the plenum chamber 210 and has a plurality of openings corresponding to the gas discharge pipes 250.

The plenum chamber 210 may have 3 to 10 annular partition walls 220.

The plurality of gas discharge pipes 250 may have one or more shapes selected from the group consisting of a throttle nozzle, a venturi nozzle, and a jet nozzle.

The gas distribution unit may further include a plurality of cooling channels 257 for cooling each gas discharge pipe adjacent to the plurality of gas discharge pipes 250.

The perforated plate 290 may have a shape in which the center is more concave than the edge thereof.

The gas distribution unit may further include an annular space located at the center of the concentric circle, and a product collection pipe 260 passing through the center of the perforated plate.

According to another embodiment of the present invention, there is provided a fluidized bed reactor system for the preparation of granular polysilicon, including:

the above-described gas distribution unit 200;

a fluidized bed reaction chamber 100 disposed on the perforated plate of the gas distribution unit and having a silicon seed inlet;

a fluidizing gas tank 300 connected to gas supply pipes 240 of the gas distribution unit 200 via respective independent fluidizing gas flow rate controllers 350;

a silicon source gas tank 400 connected to the gas supply pipes of the gas distribution unit 200 via respective independent silicon source gas flow rate controllers 450; and a fluidized bed monitoring unit 500 for monitoring the state of the fluidized bed of the silicon seed formed in the fluidized bed reaction chamber 100 and transmitting an electrical signal 530 to the respective fluidizing gas flow rate controllers 350 and the respective silicon source gas flow rate controllers 450.

The fluidized bed reaction chamber 100 includes a first body portion 110, a second body portion 120, and a head portion 130 which are sequentially connected to the perforated plate 290 of the gas distribution unit to form an inner space.

The first body portion 110 includes a plurality of reaction tubes 115 arranged radially and spaced apart from each other on the perforated plate and providing a plurality of reaction spaces connected to the second body portion 120, and a plurality of heating portions 117 surrounding at least a part of the outer peripheral surface of the reaction tube 115.

The second body portion 120 provides one reaction space connected to the plurality of reaction tubes 115 of the first body portion 110.

The head portion 130 seals the upper portion of the fluidized bed reaction chamber, and may have a larger diameter than the second body portion 120.

According to another embodiment of the invention, there is provided a method for preparing granular polysilicon using the fluidized bed reactor system.

The method for preparing the granular polysilicon includes:

a step of supplying a fluidizing gas and a silicon source gas to a fluidized bed reaction chamber to form a fluidized bed of a silicon seed;

a step of depositing silicon on the surface of the silicon seed in contact with the silicon source gas to grow the silicon seed;

a step of collecting the silicon seed of which fluidity has been reduced by the growth from the fluidized bed reaction chamber; and a step of injecting the silicon seed into the fluidized bed reaction chamber, wherein the above steps are performed continuously and repeatedly, and flow rates of the fluidizing gas and the silicon source gas supplied to the respective annular spaces through a plurality of gas supply pipes can each be independently controlled in accordance with the state of the fluidized bed monitored in the fluidized bed monitoring device of the fluidized bed reactor system.

In the step of forming the fluidized bed of the silicon seed, the fluidized bed of the silicon seed includes:

a bubbling fluidized bed which is maintained at a height of 3 to 6 times the diameter of the fluidized bed reaction chamber, with more than 85 mol % of the fluidizing gas and less than 15 mol % of the silicon source gas being uniformly supplied to the plurality of annular spaces of the plenum chamber; and a spout fluidized bed which is maintained at a height of 1.2 to 1.7 times the initial height of the bubbling fluidized bed, with less than 85 mol % of the fluidizing gas and 15 mol % or more of the silicon source gas being supplied to the annular space located within ⅓ radius of the plenum chamber, and only the fluidizing gas being supplied to the remaining annular space, wherein the bubbling fluidized bed and the spout fluidized bed are continuously and repeatedly transited over the entire preparing process, and the silicon seed of which fluidity has been reduced by the above growth can be collected in the section where the fluidized bed of the silicon seed is transited from the spout fluidized bed to the bubbling fluidized bed.

In the gas distribution unit 200 of the fluidized bed reactor system, only the fluidizing gas may be supplied to the annular space located at the outermost portion of the plenum chamber 210 throughout the entire manufacturing process.

The silicon source gas may be a gas containing at least one selected from the group consisting of monosilane ($SiH_4$), disilane ($Si_2H_6$), dichlorosilane ($SiH_2Cl_2$), trichlorosilane ($SiHCl_3$), and silicon tetrachloride ($SiCl_4$).

The fluidizing gas may be a gas containing at least one selected from the group consisting of hydrogen, nitrogen, argon, and helium.

The silicon seed injected into the fluidized bed reaction chamber can have a particle size of 50 to 800 μm.

Advantageous Effects

A gas distribution unit for a fluidized bed reactor system according to the present invention enables gas flow rate control and gas composition control for each zone within the plenum chamber. In addition, a fluidized bed reactor system having the gas distribution unit enables shape control of a fluidized bed (in particular, transition between a bubbling fluidized bed and a spout fluidized bed). The method for preparing granular polysilicon using the fluidized bed reactor system not only simultaneously improves process stability and productivity, but also enables more flexible handling in the event of an abnormal situation.

BRIEF DESCRIPTION OF THE DRAWING

FIG. 1 is a longitudinal sectional view of a fluidized bed reactor according to one embodiment of the invention.

FIG. 2 is a longitudinal sectional view of a gas distribution unit according to one embodiment of the invention.

FIG. 3 is a cross-sectional view of a gas distribution unit according to one embodiment of the invention.

FIG. 4 is a schematic diagram of a fluidized bed reactor system according to one embodiment of the invention.

FIGS. 5 and 6 are perspective views schematically showing a structure of a fluidized bed reaction chamber according to one embodiment of the present invention.

FIG. 7 is a graph schematically showing a change in height of a fluidized bed according to an operation time in a method for preparing granular polysilicon according to one embodiment of the present invention.

EXPLANATION OF SIGN

| | |
|---|---|
| 100: fluidized bed reaction chamber | 110: first body portion |
| 115: reaction tube | 117: heating portion |
| 120: second body portion | 130: head portion |
| 200: gas distribution unit | 210: plenum chamber |
| 290: perforated plate | 220: annular partition wall |
| 230: annular space | 232: gas inlet |
| 235: gas outlet | 240: gas supply pipe |
| 250: gas discharge pipe | 257: cooling channel |
| 260: product collection pipe | 300: fluidizing gas tank |
| 350: fluidizing gas flow rate controller | 400: silicon source gas tank |
| 450: silicon source gas flow rate controller | |
| 500: fluidized bed monitoring device | 530: electrical signal |
| B: bubbling fluidized bed | S: spout fluidized bed |

DETAILED DESCRIPTION OF THE EMBODIMENTS

Hereinafter, a gas distribution unit for a fluidized bed reactor system, a fluidized bed reactor system having the gas distribution unit, and a method for preparing granular polysilicon using the fluidized bed reactor system according to the present invention will be described in more detail.

Technical terms in the present specification are only for mentioning specific embodiments, and they are not intended to restrict the present invention throughout the specification unless explicitly stated.

The singular expressions used herein may include the plural expressions unless they are differently expressed contextually. The meaning of the term "include" or "comprise" used in the specification embodies specific characteristics, regions, integers, steps, operations, elements, and/or components, and does not exclude existence or addition of other specific characteristics, regions, integers, steps, operations, elements, components, and/or groups.

While terms including ordinal numbers, such as "first," "second," etc., may be used to describe various components, such components are not limited by the above terms. The above terms including ordinal numbers are used only to distinguish one component from another component. For example, a first component may be referred to as a second component without departing from the scope of the present invention, and likewise a second component may be referred to as a first component.

I. Gas Distribution Unit

Conventionally known fluidized bed reactors for the preparation of granular polysilicon have been mostly designed so as to be able to form a bubbling fluidized bed or a spout fluidized bed, so a transition between a bubbling fluidized bed and a spout fluidized bed in one reactor is practically impossible.

However, according to the studies of the present inventors, it has been found that, when a gas distribution unit having a structure capable of independently controlling the flow rate and/or composition of gas for each zone in a plenum chamber is applied in a fluidized bed reactor system, the transition between the bubbling fluidized bed and the spout fluidized bed in one system is possible.

In addition, when such a fluidized bed reactor system is applied to the preparation of granular polysilicon, it is possible to improve process stability and productivity at the same time, and also to enable more flexible handling in the event of an abnormal situation (for example, layer separation, deposition on reactor walls, formation of agglomerates, etc.).

According to one embodiment of this invention, there is provided a gas distribution unit 200 for a fluidized bed reactor system that injects a gas into a fluidized bed reaction chamber 100 via a plenum chamber 210 and a perforated plate 290, wherein the plenum chamber 210 includes: a plurality of annular partition walls 220 arranged concentrically and spaced apart from each other; a plurality of annular spaces 230 partitioned by the annular partition walls and each independently having at least one gas inlet 232 and a plurality of gas outlets 235; a plurality of gas supply pipes 240 connected to the gas inlets 232 and independently supplying a gas to the annular spaces 230; and a plurality of gas discharge pipes 250 connected to the respective gas outlets 235, and the perforated plate 290 is in contact with the end of the gas discharge pipes 250 of the plenum chamber 210 and has a plurality of openings corresponding to the gas discharge pipes 250.

Referring to FIG. 1, a fluidized bed reactor according to an embodiment of the present invention includes a fluidized bed reaction chamber 100 for providing a space where a fluidized bed reaction occurs, and a gas distribution unit 200 for injecting gas into the fluidized bed reaction chamber 100.

In FIGS. 2 and 3, the gas distribution unit 200 is shown in more detail. According to an embodiment of the invention, the gas distribution unit 200 is in the form of a combination of a plenum chamber 210 and a perforated plate 290.

Specifically, the plenum chamber 210 includes: a plurality of annular partition walls 220 arranged concentrically and spaced apart from each other; a plurality of annular spaces 230 partitioned by the annular partition walls and each independently having at least one gas inlet 232 and a plurality of gas outlets 235; a plurality of gas supply pipes 240 which are connected to the gas inlets 232 and each independently supplying gas to the annular spaces 230; and a plurality of gas discharge pipes 250 connected to the respective gas outlets 235.

Here, the plenum chamber 210 may have 3 to 10 annular partition walls 220. That is, the plenum chamber 210 may have 3 to 10 annular spaces 230 partitioned by the annular partition walls 220.

In each of the annular spaces 230, at least one gas inlet 232 into which the gas flows is located at a lower position. In addition, a plurality of gas outlets 235 through which gas is discharged are located at the upper portion of the respective annular spaces 230. That is, the gas that has flowed into the lower portion of the respective annular spaces 230 through at least one gas inlet 232 is discharged through the plurality of gas outlets 235 located at the upper portion of the respective annular spaces 230.

A plurality of gas supply pipes 240 each independently supplying gas to the annular spaces 230 are connected to the gas inlet 232. A plurality of gas discharge pipes 250 corresponding thereto are connected to the plurality of gas outlets 235.

Here, the plurality of gas discharge pipes 250 may have a shape capable of amplifying the flow velocity (momentum) of the gas discharged from the respective annular spaces 230. Preferably, the plurality of gas discharge pipes 250 may have one or more shapes selected from the group consisting of a throttle nozzle, a venturi nozzle, and a jet nozzle.

According to an embodiment of the present invention, a plurality of cooling channels 257 for cooling the respective gas discharge pipes may be provided adjacent to the plurality of gas discharge pipes 250. In the cooling channels 257, a fluid such as air or cooling water for cooling the gas discharge pipes 250 is circulated. Thereby, it is possible to prevent the source gas from being thermally decomposed and deposited around the gas discharge pipes 250.

Meanwhile, the perforated plates 290 are in contact with the ends of the gas discharge pipes 250 of the plenum chamber 210, and each has a plurality of openings (not shown) corresponding to the gas discharge pipes 250. For example, when the gas discharge pipes 250 are a throttle nozzle in the form of a cone, the ends of each cone are in contact with the perforated plates 290, and a plurality of openings corresponding to each throttle nozzle are formed in the perforated plates 290. The ends of each cone may be in contact with each other.

The perforated plates 290 may have a shape in which the center is more concave than the edge. That is, the gas discharge pipes in contact with the edge of the perforated plate 290 can have a longer length than the gas discharge pipe in contact with the central portion of the perforated plate 290. Thereby, dead zones where seeds are stagnated in the fluidized bed reaction chamber 100 can be minimized.

According to an embodiment of the present invention, a product collection pipe 260 disposed concentrically with the annular partition walls 200 may be provided. The product collection pipe 260 passes through the annular space located at the center of the concentric circle and the center of the perforated plate. In the fluidized bed reaction chamber 100, products having reduced fluidity can be collected through the product collection pipe 260 and transferred to a reservoir.

II. Fluidized Bed Reactor System

On the other hand, according to another embodiment of the present invention, there is provided a fluidized bed reactor system for the preparation of granular polysilicon, including:

the above-described gas distribution unit 200;

a fluidized bed reaction chamber 100 disposed on the perforated plate of the gas distribution unit and having a silicon seed inlet;

a fluidizing gas tank 300 connected to gas supply pipes 240 of the gas distribution unit 200 via respective independent fluidizing gas flow rate controllers 350;

a silicon source gas tank 400 connected to the gas supply pipes of the gas distribution unit 200 via respective independent silicon source gas flow rate controllers 450; and a fluidized bed monitoring unit 500 for monitoring the state of the fluidized bed of the silicon seed formed in the fluidized bed reaction chamber 100 and transmitting an electrical signal 530 to the respective fluidizing gas flow rate controllers 350 and the respective silicon source gas flow rate controllers 450.

Referring to FIG. 4, a fluidized bed reactor system according to an embodiment of the present invention includes a fluidized bed reactor having a fluidized bed reaction chamber 100 and a gas distribution unit 200, a fluidizing gas tank 300, a silicon source gas tank 400, and a fluidized bed monitoring unit 500.

In particular, a plurality of gas supply pipes 240 for supplying gas to the annular spaces 230 from the gas distribution unit 200 are each independently connected to the fluidized gas tank 300 via the fluidized gas flow rate controllers 350. At the same time, the plurality of gas supply pipes 240 are each independently connected to the silicon source gas tank 400 via the silicon source gas flow rate controllers 450.

With these connection structures, a gas obtained by individually controlling the composition and/or flow rate of the fluidizing gas and the silicon source can be supplied to each gas supply pipe 240.

As a result, a gas of which composition and/or flow rate are individually controlled can be supplied to the respective annular spaces 230 in the gas distribution unit 200, and if necessary, the shape control of the fluidized bed (particularly, transition between the bubbling fluidized bed and the spout fluidized bed) can be easily performed.

The fluidizing gas flow rate controller 350 and the silicon source gas flow rate controller 450 are separately controlled with a PLC (programmable logic control) or manual control system by the fluidized bed monitoring unit 500.

Specifically, the fluidized bed monitoring unit 500 monitors the state of the fluidized bed formed in the fluidized bed reaction chamber 100 (for example, the amount of increase in the differential pressure due to seed growth, the variation in the height of the fluidized bed, the power change amount caused by heating of the reaction chamber, etc.).

The fluidized bed monitoring unit 500 may then transmit individual electrical signals 530 to the fluidizing gas flow rate controllers 350 and the silicon source gas flow rate controllers 450 in accordance with the programmed or manual settings corresponding to the state of the fluidized bed, thereby controlling the composition and/or the flow rate of the gas supplied to the respective annular spaces 230 of the plenum chamber 210.

Meanwhile, the fluidized bed reaction chamber 100 is a space in which a fluidized gas and a silicon source gas are supplied to form a fluidized bed of a silicon seed, and may be a conventional type of reaction chamber known in the technical field to which the invention pertains.

Preferably, the fluidized bed reaction chamber 100 includes a first body portion 110, a second body portion 120, and a head portion 130, which are sequentially connected to the perforated plate 290 of the gas distribution unit to form an inner space; the first body portion 110 includes a plurality of reaction tubes 115 arranged radially and spaced from each other on the perforated plates to provide a plurality of reaction spaces connected to the second body portion 120, and a plurality of heating portions 117 surrounding at least a part of an outer peripheral surface of the heating tubes 115; the second body portion 120 provides one reaction space connected to the plurality of reaction tubes 115 of the first body portion 110; and the head portion 130 may seal the upper portion of the fluidized bed reaction chamber and may have a larger diameter than the second body portion 120.

According to studies of the present inventors, it was found that, when the fluidized bed formed in the lower portion of the fluidized bed reaction chamber is divided into a plurality of partition walls and the divided regions are respectively heated from the outside, productivity of the polysilicon can be increased by improving the heating efficiency. Through the improved heating method as described above, non-uniformity of temperatures in the reactor according to the conventional external heating method, contamination of polysilicon according to the conventional internal heating method, and the instability of the process operation can be easily solved. Furthermore, this improved heating method can increase the number of divided regions to achieve uniform heating efficiency, even when it is necessary to expand the scale of the reactor in order to increase the production scale.

FIGS. 5 and 6 are perspective views schematically showing a structure of a fluidized bed reaction chamber according to one embodiment of the present invention.

The first body portion 110, the second body portion 120, and the head portion 130 are independently constituted and joined to each other or integrally formed to provide one inner space.

Among them, the head portion 130 seals the upper portion of the fluidized bed reaction chamber 100 and is connected to the second body portion 120.

According to an embodiment of the present invention, the head portion 130 may preferably have a larger diameter than the second body portion 120. This is for the purpose of decreasing the flow velocity of the gas or fine particles entering from the second body portion 120 into the head portion 130. Thereby, the burden of after-treatment for the gas or fine particles discharged after the operation of the reactor can be reduced.

The first body portion 110 is located below the head portion 130 and connected to the head portion 130, and provides a space in which a deposition reaction of polysilicon occurs.

The first body portion 110 is located below the second body portion 120 and is connected to and in contact with the second body portion 120 and the perforated plate 290 of the above-described gas distribution unit, and provides a space in which at least one of the precipitation reaction or the heating reaction of polysilicon occurs.

In particular, the first body portion 110 has a plurality of reaction tubes 115 and a plurality of heating portions 117 surrounding the outer peripheral surfaces of the respective reaction tubes.

That is, unlike a conventional fluidized bed reactor in which the inside of the fluidized bed reaction chamber is composed of one reaction space, the fluidized bed reactor system according to an embodiment of the present invention may be a system in which a lower region (fluidized bed-forming region) of the fluidized bed reaction chamber 100 having one inner space is divided into multiple reaction spaces.

Specifically, the first body portion 110 has a plurality of reaction tubes 115 that are spaced radially from each other on the perforated plate 290 and provide a plurality of reaction spaces connected to the second body portion 120.

The reaction tubes 115 are connected to the second body portion 120 to form one inner space while providing a plurality of reaction spaces (a plurality of fluidized bed-forming regions).

Here, the reaction tubes 115 may be disposed at a position corresponding to the gas outlet 235 of the gas distribution unit 200.

The first body portion 110 has a plurality of heating portions 117 surrounding at least a part of the outer peripheral surface of the reaction tubes 115. The heating portions 117 heat the respective reaction spaces so that silicon can be deposited on the surface of the silicon seed in the reaction tube 115. It is preferable that the heating portion 117 may be formed so as to surround the entire outer peripheral surface of the reaction tubes 115 from the viewpoint of improving the heating efficiency.

As described above, the fluidized bed reactor system according to one embodiment of the present invention has a plurality of reaction spaces to be individually heated, and thus it is possible to uniformly heat the reaction spaces, as compared with the external heating type reactor for one reaction space.

In such an improved heating method, the number of the reaction tubes 115 disposed radially and spaced apart from each other on the perforated plate 290 can be adjusted to an appropriate range as required, and this makes it possible to achieve uniform heating efficiency by individual heating. Therefore, the fluidized bed reactor system to which the above-described fluidized bed reaction chamber is applied has the advantage that it can more flexibly cope with the expansion of production scale together with improvement of the productivity.

Hereinafter, a method of operating the fluidized bed reactor system will be described with reference to an example of the method of preparing granular polysilicon.

III. Method for Preparing Granular Polysilicon

According to another embodiment of the invention, a method of preparing granular polysilicon using the fluidized bed reactor system described above is provided.

Specifically, the method for preparing the granular polysilicon includes:

a step of supplying a fluidizing gas and a silicon source gas to a fluidized bed reaction chamber to form a fluidized bed of a silicon seed;

a step of depositing silicon on the surface of the silicon seed in contact with the silicon source gas to grow the silicon seed;

a step of collecting the silicon seed of which fluidity has been reduced by the growth from the fluidized bed reaction chamber; and a step of injecting the silicon seed into the fluidized bed reaction chamber, wherein the above steps are performed continuously and repeatedly, and flow rates of the fluidizing gas and the silicon source gas supplied to the respective annular spaces through a plurality of gas supply pipes are each independently controlled in accordance with the state of the fluidized bed monitored in the fluidized bed monitoring device of the fluidized bed reactor system.

In the step of forming the fluidized layer of the silicon seed, the silicon seed may be prepared by pulverizing and classifying a high-purity polysilicon mass. At this time, the particle diameter of the silicon seeds injected into the fluidized bed reaction chamber 100 can be determined within a range suitable for fluidization of particles such as a minimum fluidization velocity. Preferably, the silicon seed may have a particle diameter of 50 to 800 µm, 100 to 700 µm, or 100 to 500 µm.

The prepared silicon seeds are supplied to the fluidized bed reaction chamber 100 in an appropriate amount, and the supplied silicon seeds form a fluidized bed by the gas discharged to the fluidized bed reaction chamber 100 via the gas distribution unit 200. At this time, the composition and the flow rate of the gas discharged through the gas distribution unit 200 may vary depending on the region of the fluidized bed reaction chamber 100 corresponding to the annular spaces 230 of the plenum chamber 210 and the state of the fluidized bed.

Depending on the region of the fluidized bed reaction chamber 100 and the state of the fluidized bed, there is a difference in composition and flow rate, but the gas supplied to the fluidized bed reaction chamber 100 is a fluidizing gas, a silicon source gas, or a mixed gas thereof. Here, the fluidizing gas may be a gas containing one or more selected from the group consisting of hydrogen, nitrogen, argon, and helium. The silicon source gas may be a gas containing one or more selected from the group consisting of monosilane ($SiH_4$), disilane ($Si_2H_6$), dichlorosilane ($SiH_2Cl_2$), trichlorosilane ($SiHCl_3$), and silicon tetrachloride ($SiCl_4$).

The internal temperature of the fluidized bed reaction chamber 100 is maintained within the decomposition temperature of the silicon source gas and the melting temperature of the silicon, and is preferably maintained at 500 to 1000° C., or 600 to 800° C.

In order to maintain the internal temperature of the fluidized bed reaction chamber 100, a conventional heating system such as an electrical resistance heater disposed outside the reactor wall may be used. As shown in FIGS. 5 and 6, when a fluidized bed reaction chamber 100 having a plurality of reaction tubes 115 is used, a plurality of heating portions 117 surrounding at least a part of the outer peripheral surface of the respective reaction tubes can be introduced, thereby improving the heating efficiency.

Further, the internal pressure of the fluidized bed reaction chamber 100 can be maintained at normal pressure or higher (for example, a pressure of 1 to 10 bar).

Meanwhile, the silicon source gas supplied to the fluidized bed of the silicon seed is thermally decomposed (for example, $SiH_4 \leftrightarrow Si+2H_2$) on the surface of the heated silicon seed. As a result, silicon is deposited (precipitated) on the surface of the silicon seed, so the particle diameter of the silicon seed gradually increases.

Silicon seeds of which fluidity has been reduced due to such growth gradually settle to the bottom of the fluidized bed. The silicon seeds having reduced fluidity are collected through the product collection pipe 260. In consideration of the amount of the collected product and the state of the fluidized bed, a new silicon seed is injected into the fluidized bed reaction chamber 100.

A series of steps described above can be performed continuously and repeatedly.

In particular, in the method for preparing the granular polysilicon according to the embodiment of the present invention, the flow rate of the fluidizing gas and the silicon source gas supplied to each of the annular spaces 230 via a plurality of gas supply pipes 240 can be independently controlled using the fluidized bed reactor system described above, depending on the state of the fluidized bed monitored by the fluidized bed monitoring unit 500.

In this regard, the conventional fluidized bed reactor for the preparation of granular polysilicon is mostly designed so as to be able to form a bubbling fluidized bed or a spout fluidized bed, and thus the transition between a bubbling fluidized bed and a spout fluidized bed in one reactor was practically impossible.

However, the fluidized bed reactor system according to the present invention is capable of independently controlling the flow rate and/or composition of the gas for each annular space 230 in the plenum chamber 210, as described above. The transition between the bubbling fluidized bed and the spout fluidized bed can be easily achieved. The present invention can simultaneously have the advantages of the methods using a bubbling fluidized bed and that using a spout fluidized bed by applying such a fluidized bed reactor system to a method for preparing granular polysilicon.

For example, in the method for preparing the granular polysilicon, the fluidized bed of the silicon seed includes:

a bubbling fluidized bed which is maintained at a height of 3 to 6 times the diameter of the fluidized bed reaction chamber, with more than 85 mol % of the fluidizing gas and less than 15 mol % of the silicon source gas being uniformly supplied to the plurality of annular spaces of the plenum chamber; and a spout fluidized bed which is maintained at a height of 1.2 to 1.7 times the initial height of the bubbling fluidized bed, with less than 85 mol % of the fluidizing gas and 15 mol % or more of a silicon source gas being supplied to the annular space located within ⅓ the radius of the plenum chamber, and only the fluidizing gas being supplied to the remaining annular space, wherein the bubbling fluidized bed and the spout fluidized bed are continuously and repeatedly transited over the entire preparing process, and the silicon seed of which fluidity has been reduced by the above growth can be collected in the section where the fluidized bed of the silicon seed is transited from the spout fluidized bed to the bubbling fluidized bed.

Referring to FIG. 7, at the beginning of operation, the fluidized bed of the silicon seed is operated with a bubbling fluidized bed (B). Specifically, the concentration of the silicon source gas at the beginning of operation may be maintained at less than 15 mol % or at most 10 mol %, and the flow velocity ratio ($U/U_{mf}$) of the gas supplied to the fluidized bed reaction chamber 100 may be maintained at 3 to 5. Here, the flow velocity ratio ($U/U_{mf}$) of the gas means a ratio between a minimum fluidization velocity (Umf) and an actual injection velocity (U) of the gas. The minimum fluidization velocity may be set on the basis of the surface temperature of the perforated plate 290, which is lower by 300° C. or more than the reaction temperature, in consideration of the decrease in the momentum caused by decomposition of the silicon source gas.

The gas controlled by the above composition and flow rate is supplied to each annular space 230 through each gas supply pipe 240, and the supplied gas is uniformly discharged to the fluidized bed reaction chamber 100 from each annular space 230. At this time, in order to minimize the deposition of silicon on the inner wall of the fluidized bed reaction chamber 100, it is preferable to supply only the fluidizing gas to the annular space located at the outermost position of the plenum chamber 210 throughout the entire preparing process.

A bubbling fluidized bed (B) of a silicon seed having a constant and repeated turbulent flow pattern is formed by the gas thus discharged. At this time, the height (a) of the fluidized bed at the beginning of the operation may be set to 3 to 6 times, or 4 to 5 times, the diameter of the fluidized bed reaction chamber 100.

When the silicon seed gradually grows under such a bubbling fluidized bed situation, the composition and/or the flow rate of the gas supplied to the fluidized bed reaction chamber 100 are controlled so that the operation is carried out so as to gradually transit from the bubbling fluidized bed (B) to the spout fluidized bed (S). That is, the fluidized bed monitoring unit 500 monitors the state of the fluidized bed formed in the fluidized bed reaction chamber 100 (for example, the amount of increase in the differential pressure due to seed growth, the variation in the height of the fluidized bed, the power change amount caused by heating of the reaction chamber, etc.). The fluidized bed monitoring unit 500 may then transmit individual electrical signals 530 to the fluidized gas flow rate controllers 350 and the silicon source gas flow rate controllers 450 in accordance with programmed or manual settings corresponding to the fluidized bed conditions, thereby controlling the composition and/or the flow rate of the gas supplied to each annular space 230 of the plenum chamber 210.

In transiting from the bubbling fluidized bed (B) to the spout fluidized bed (S), the composition and flow rate of the gas can be sequentially changed from the annular space located at the outer periphery of the plenum chamber 210 toward the annular space located at the center. For example, the respective silicon source gas flow rate controllers 450 are controlled to stop supplying the silicon source gas stepwise from the annular space located outside the plenum chamber 210, and only the fluidizing gas having a flow velocity ratio $(U/U_{mf})$ of 1 to 2 are supplied. At the same time, the flow rate of the gas supplied to the annular space at the center is increased by the flow rate of the silicon source gas and the fluidizing gas of which supply is reduced at the outer periphery. The flow rate of the total gas may be maintained at an initial injection amount or can be maintained as high as 10 to 20% compared to the initial level.

When such a transition process is completed, the flow rate of the silicon source gas supplied to the annular space at the central portion is gradually increased. Finally, the silicon source gas is intensively supplied only to the annular space at the central portion, and only the fluidizing gas having the flow velocity ratio $(U/U_{mf})$ of 1 to 2 is supplied to the remaining annular space and transited into the spout fluidized bed (S).

The "annular space at the central portion" through which the silicon source gas is intensively supplied in the spout fluidized bed may be differently set depending on the operation conditions of the spout fluidized bed. Preferably, the annular space at the central portion may mean an annular space located within ⅓ or ⅕ of the radius of the plenum chamber 210. In addition, the annular space at the central portion may mean one annular space located at the center of the concentric circle.

The height of the fluidized bed in the spout fluidized bed may be maintained at 1.2 to 1.7 times the initial height of the bubbling fluidized bed. Less than 85 mol % of fluidizing gas and 15 mol % or more of silicon source gas may be supplied to the annular space of the center portion.

When the silicon seeds gradually grow under such an spout fluidized bed, the composition and/or the flow rate of the gas supplied to the fluidized bed reaction chamber 100 is controlled depending on the state of the fluidized bed monitored in the fluidized bed monitoring unit 500, so that the operation is carried out so as to gradually transit from the spout fluidized bed (S) to the bubbling fluidized bed (B).

Then, in the section where the fluidized bed of the silicon seed is transited from the spout fluidized bed (S) to the bubbling fluidized bed (B), the silicon seed of which fluidity has been reduced by the growth can be collected through the product collection pipe 260.

Through the above-described method, a granular polysilicon product having a particle diameter of 1.3 to 4 times or 1.5 to 2 times the initial particle diameter of the silicon seed can be obtained. By the above-described method, a granular polysilicon product having a large particle size can be obtained, thereby extending the injection cycle of the silicon seed and reducing the production costs of the polysilicon.

Furthermore, the above-described method for preparing granular polysilicon enables more flexible handling in the event of abnormal conditions (for example, layer separation, deposition of reactor walls, formation of agglomerates, etc.) that may occur during operation of the process.

For example, in the preparation of granular polysilicon in which monosilane or trichlorosilane is used as a silicon source gas, the greatest cause of an emergency such as shutdown is the formation of agglomerates in the fluidized bed. Agglomerates are formed when non-flowing zones are present in the fluidized bed, and these non-flowing zones are caused by slugging, rapid formation of fine particles, and layer separation due to particle growth. Whether or not the agglomerates are formed can be detected by irregular fluctuation of the differential pressure tendency of the fluid passing through the fluidized bed, abnormal temperature rise in a specific section, and the like.

In the event of such an abnormal situation, the amount of the silicon source gas supplied to the annular spaces 230 of the plenum chamber 210 is reduced to 5 mol % or less, whereby the reduced momentum of gas is replenished by increasing the flow rate of the gas. Then, pulse feeding for intermittently increasing the injection amount of fluidizing gas is carried out for each annular space 230. Such pulse feeding can be carried out sequentially in the order of from the annular spaces located at the center to the annular space located at the outermost portion of the plenum chamber (210) (or vice versa). Alternatively, it can be carried out by a method of random supply to each annular space. The pulse feeding can then continue until there are no signs of formation of agglomerates.

As described above, a gas distribution unit having a structure capable of independently controlling the flow rate and/or composition of gas in each zone in the plenum chamber enables transition between a bubbling fluidized bed and a spout fluidized bed in one system. In addition, by applying the fluidized bed reactor system having the gas distribution unit to the preparation of the granular polysilicon, it is possible to not only improve the stability and the productivity of the process at the same time, but to also enable more flexible handling in the event of abnormal situations that may occur in the course of the operation of the process.

The invention claimed is:

1. A gas distribution unit (200) for a fluidized bed reactor system that injects a gas into a fluidized bed reaction chamber 100 via a plenum chamber (210) and a perforated plate (290),
   wherein the plenum chamber (210) includes: a plurality of annular partition walls (220) arranged concentrically and spaced apart from each other; a plurality of annular spaces (230) partitioned by the annular partition walls and each independently having at least one gas inlet (232) and a plurality of gas outlets (235); a plurality of gas supply pipes (240) connected to the gas inlets (232)

and independently supplying gas to the annular spaces (230); and a plurality of gas discharge pipes (250) connected to the respective gas outlets (235), and wherein the perforated plate (290) is in contact with an end of the gas discharge pipes (250) of the plenum chamber (210) and has a plurality of openings corresponding to the gas discharge pipes (250).

2. The gas distribution unit for a fluidized bed reactor system according to claim 1, wherein the plenum chamber (210) has 3 to 10 annular partition walls (220).

3. The gas distribution unit for a fluidized bed reactor system according to claim 1, wherein the plurality of gas discharge pipes (250) have one or more shapes selected from the group consisting of a throttle nozzle, a venturi nozzle, and a jet nozzle.

4. The gas distribution unit for a fluidized bed reactor system according to claim 1, wherein the gas distribution unit further includes a plurality of cooling channels (257) for cooling each gas discharge pipe adjacent to the plurality of gas discharge pipes (250).

5. The gas distribution unit for a fluidized bed reactor system according to claim 1, wherein the perforated plate (290) has a shape in which the center is more concave than the edge.

6. The gas distribution unit for a fluidized bed reactor system according to claim 1, wherein the gas distribution unit further includes an annular space located at a center of the concentric circle and a product collection pipe (260) passing through a center of the perforated plate.

7. A fluidized bed reactor system for the preparation of granular polysilicon, comprising:
the gas distribution unit (200) according to any one of claims 1 to 6;
a fluidized bed reaction chamber (100) disposed on the perforated plate of the gas distribution unit and having a silicon seed inlet;
a fluidizing gas tank (300) connected to gas supply pipes (240) of the gas distribution unit (200) via respective independent fluidizing gas flow rate controllers (350);
a silicon source gas tank (400) connected to the gas supply pipes of the gas distribution unit (200) via respective independent silicon source gas flow rate controllers (450); and
a fluidized bed monitoring unit (500) for monitoring a state of the fluidized bed of the silicon seed formed in the fluidized bed reaction chamber (100) including a differential pressure due to a seed growth, a height variation of the fluidized bed, and a power change, and transmitting an electrical signal (530) to the respective fluidizing gas flow rate controllers (350) and the respective silicon source gas flow rate controllers (450) so as to control flow rates of the fluidizing gas and the silicon gas.

8. The fluidized bed reactor system for the preparation of granular polysilicon according to claim 7, wherein the fluidized bed reaction chamber (100) includes a first body portion (110), a second body portion (120), and a head portion (130) which are sequentially connected to the perforated plate (290) of the gas distribution unit to form an inner space;
the first body portion (110) includes a plurality of reaction tubes (115) disposed radially and spaced apart from each other on the perforated plate and providing a plurality of reaction spaces connected to the second body portion (120), and a plurality of heating portions (117) surrounding at least a portion of the outer peripheral surface of the reaction tube (115);

the second body portion (120) provides one reaction space connected to the plurality of reaction tubes (115) of the first body portion (110); and
the head portion (130) seals the upper portion of the fluidized bed reaction chamber (100) and has a larger diameter than the second body portion (120).

9. A method for preparing granular polysilicon using a fluidized bed reactor system, comprising:
supplying a fluidizing gas and a silicon source gas to the fluidized bed reaction chamber (100) to form a fluidized bed of a silicon seed;
depositing silicon on a surface of the silicon seed in contact with the silicon source gas to grow the silicon seed;
collecting the silicon seed of which fluidity has been reduced by the growth from the fluidized bed reaction chamber(100); and
injecting the silicon seed into the fluidized bed reaction chamber(100),
wherein the above steps are performed continuously and repeatedly, and
flow rates of the fluidizing gas and the silicon source gas supplied to the respective annular spaces through the gas supply pipes (240) are each independently controlled in accordance with a state of the fluidized bed monitored in the fluidized bed monitoring unit (500) of the fluidized bed reactor system,
wherein the fluidized bed reactor system comprise
the gas distribution unit (200) according to any one of claims 1 to 6;
a fluidized bed reaction chamber (100) disposed on the perforated plate of the gas distribution unit and having a silicon seed inlet;
a fluidizing gas tank (300) connected to gas supply pipes (240) of the gas distribution unit (200) via respective independent fluidizing gas flow rate controllers (350);
a silicon source gas tank (400) connected to the gas supply pipes of the gas distribution unit (200) via respective independent silicon source gas flow rate controllers (450); and
a fluidized bed monitoring unit (500) for monitoring a state of the fluidized bed of the silicon seed formed in the fluidized bed reaction chamber (100) including a differential pressure due to seed growth, a height variation of the fluidized bed, and a power change and transmitting an electrical signal (530) to the respective fluidizing gas flow rate controllers (350) and the respective silicon source gas flow rate controllers (450) so as to control flow rates of the fluidizing gas and the silicon source gas.

10. The method for preparing granular polysilicon according to claim 9, wherein the fluidized bed of the silicon seed includes:
a bubbling fluidized bed which is maintained at a height of 3 to 6 times the diameter of the fluidized bed reaction chamber (100), with more than 85 mol % of the fluidizing gas and less than 15 mol % of the silicon source gas being uniformly supplied to the plurality of annular spaces of the plenum chamber (210); and
a spout fluidized bed which is maintained at a height of 1.2 to 1.7 times an initial height of the bubbling fluidized bed, with less than 85 mol % of the fluidizing gas and 15 mol % or more of silicon source gas being supplied to an annular space located within ⅓ of the radius of the plenum chamber (210), and only the fluidizing gas being supplied to a remaining annular space, wherein the bubbling fluidized bed and the spout fluidized bed are continuously and repeatedly transited over the entire preparing process, and the silicon seed of which fluidity has been reduced by the growth can be collected in the section where the fluidized bed of the silicon seed is transited from the spout fluidized bed to the bubbling fluidized bed.

11. The method for preparing granular polysilicon according to claim 9, wherein in the gas distribution unit (200) of the fluidized bed reactor system, only the fluidizing gas is supplied to the annular space located at the outermost portion of the plenum chamber (210).

12. The method for preparing granular polysilicon according to claim 9, wherein the silicon source gas is a gas containing at least one selected from the group consisting of monosilane ($SiH_4$), disilane ($Si_2H_6$), dichlorosilane ($SiH_2Cl_2$), trichlorosilane ($SiHC_{13}$), and silicon tetrachloride ($SiCl_4$).

13. The method for preparing granular polysilicon according to claim 9, wherein the fluidizing gas is a gas containing at least one selected from the group consisting of hydrogen, nitrogen, argon, and helium.

14. The method for preparing granular polysilicon according to claim 9, wherein the silicon seed injected into the fluidized bed reaction chamber can have a particle size of 50 to 800 µm.

* * * * *